(12) United States Patent
Hautala et al.

(10) Patent No.: US 7,825,389 B2
(45) Date of Patent: Nov. 2, 2010

(54) METHOD AND APPARATUS FOR CONTROLLING A GAS CLUSTER ION BEAM FORMED FROM A GAS MIXTURE

(75) Inventors: John J. Hautala, Beverly, MA (US); Matthew C. Gwinn, Winchendon, MA (US); Jerald P. Dykstra, Austin, TX (US)

(73) Assignee: TEL Epion Inc., Billerica, MA (US)

( * ) Notice: Subject to any disclaimer, the term of this patent is extended or adjusted under 35 U.S.C. 154(b) by 316 days.

(21) Appl. No.: 11/950,128

(22) Filed: Dec. 4, 2007

(65) Prior Publication Data

US 2009/0140165 A1 Jun. 4, 2009

(51) Int. Cl.
*G21G 5/00* (2006.01)
(52) U.S. Cl. .............. 250/492.3; 250/492.1; 250/492.2; 250/492.21
(58) Field of Classification Search .............. 250/492.1, 250/492.2, 492.21, 492.3
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 5,814,194 A | 9/1998 | Deguchi et al. | |
| 6,116,080 A | 9/2000 | Logue et al. | |
| 6,297,510 B1 | 10/2001 | Farley | |
| 6,750,460 B2 * | 6/2004 | Greer | 250/492.2 |
| 7,057,191 B2 | 6/2006 | Hsu et al. | |
| 7,067,828 B2 | 6/2006 | Swenson | |
| 7,123,361 B1 | 10/2006 | Doughty | |
| 2002/0130275 A1 | 9/2002 | Mack et al. | |
| 2005/0181621 A1 | 8/2005 | Borland et al. | |
| 2005/0202657 A1 | 9/2005 | Borland et al. | |
| 2005/0205802 A1 * | 9/2005 | Swenson et al. | 250/423 R |

(Continued)

FOREIGN PATENT DOCUMENTS

EP 168812 A2 8/2006

(Continued)

OTHER PUBLICATIONS

Hautala, "GCIB Process Development for Semiconductor Applications", 4th Workshop on Cluster Ion Beam and Advanced Quantum Beam Process Technology, Tokyo, Japan, Sep. 2003 (7 pages).

(Continued)

*Primary Examiner*—Jack I Berman
*Assistant Examiner*—Hanway Chang
(74) *Attorney, Agent, or Firm*—Wood, Herron & Evans LLP

(57) ABSTRACT

Methods and apparatus for controlling a gas cluster ion beam formed from a plurality of process gases in a gas mixture. The methods and apparatus involve measuring gas analysis data relating to the composition of the gas mixture and modifying the irradiation of the workpiece in response to the detected parameter. The gas analysis data can be derived from samples of the composition of the gas mixture flowing from a gas source to the gas cluster ion beam apparatus or samples of the residual gases inside the vacuum vessel of the gas cluster ion beam apparatus.

19 Claims, 6 Drawing Sheets

U.S. PATENT DOCUMENTS

2007/0075274 A1   4/2007   Reece et al.

FOREIGN PATENT DOCUMENTS

JP        62296357 A    12/1987

OTHER PUBLICATIONS

European Patent Office, International Search Report issued in related international patent application serial No. PCT/US2008/083088 dated Aug. 10, 2009.

European Patent Office, Office Action issued in related European Application No. 03 749 734.4 dated Oct. 5, 2009.

European Patent Office, Office Action issued in related European Application No. 05 729 563.6 dated Sep. 24, 2009.

Yamada, et al., "Surface modification with gas cluster ion beams", Nuclear Instruments and Methods in Physics Research B79 (1993) 223-226 North-Holland.

Saitoh, et al., "Acceleration of cluster and molecular ions by TIARA 3 MV tandem accelerator", Nuclear Instruments and Methods in Physics Research A 452 (2000) 61-66).

* cited by examiner

METHOD AND APPARATUS FOR CONTROLLING A GAS CLUSTER ION BEAM FORMED FROM A GAS MIXTURE

FIELD OF THE INVENTION

This invention relates generally to methods and apparatus for formation of gas cluster ion beams, and, more particularly, to methods and apparatus for controlling the irradiation of a workpiece by a gas cluster ion beam formed from a gas mixture.

BACKGROUND OF THE INVENTION

Gas cluster ion beam (GCIB) processing apparatus are configured to generate cluster ion beams used for processing surfaces. In this description, gas clusters are defined as nano-sized aggregates of materials that would be gaseous under conditions of standard temperature and pressure. Such gas clusters typically consist of aggregates of from a few to several thousand molecules loosely bound to form the cluster. The clusters can be ionized by electron bombardment or other means, permitting them to be formed into directed beams having controllable energy. Such ions each typically carry positive charges of $q \cdot e$ (where e is the electronic charge and q is an integer of from one to several representing the charge state of the cluster ion). Non-ionized clusters may also exist within a cluster ion beam. The larger sized cluster ions are often the most useful because of their ability to carry substantial energy per cluster ion, while yet having only modest energy per molecule. The clusters disintegrate on impact, with each individual molecule carrying only a small fraction of the total cluster ion energy. Consequently, the impact effects of large cluster ions are substantial, but are limited to a very shallow surface region. This makes cluster ions effective for a variety of surface modification processes, without the tendency to produce deeper subsurface damage characteristic of conventional monomer ion beam processing.

Presently available cluster ion sources produce clusters ions having a wide distribution of sizes, N (where N=the number of molecules in each cluster ion—in the case of monatomic gases like argon, an atom of the monatomic gas will be referred to as a molecule and an ionized atom of such a monatomic gas will be referred to as a molecular ion—or simply a monomer ion—throughout this discussion). Many useful surface-processing effects can be achieved by bombarding surfaces with GCIBs. These processing effects include, but are not necessarily limited to, cleaning, smoothing, etching, doping, and film formation or growth.

To form gas clusters, a pressurized source gas is ejected through a nozzle into a vacuum, forming a supersonic gas jet. Cooling, which results from the expansion in the jet, causes gas in the jet to condense into clusters, each consisting of from several to several thousand weakly bound atoms or molecules. For many applications, gas clusters made from a noble gas like argon, or from a reactive gas like oxygen are useful. However, for certain applications such as semiconductor doping, reactive etching, or deposition of films having a particular desired stoichiometry, it is often desirable to form gas clusters from a gas mixture containing more than one gas in a known mixture. Such mixed gases may be purchased premixed from gas suppliers or may be mixed from separate pure source gases, immediately prior to use, using mass flow controllers or other mixing controls to achieve the required mixtures.

As with many beam processes, processing a surface with a GCIB requires careful control of the beam conditions and the beam dose. Beam dosimetry is typically done by integrating the charge-per-unit-surface that the ion beam delivers to the surface being processed. In the case of GCIB's, factors other than the beam dose can also influence the processing results. In addition to delivered dose, the average cluster ion charge state, the average cluster ion mass, and the average cluster ion energy of a GCIB can all influence the surface processing effects of a GCIB incident on a surface.

In applications requiring gas cluster ion beam processing using gas clusters formed from mixed gases, in addition to dose control and control of other beam parameters, it is often a requirement for successful processing that the mixture of gas species in the gas cluster ions be precisely known and hence it is generally necessary that the mixture or ratios of component gases of the source gas also be precisely known. For example, the precision of the doping and/or stoichiometry of deposited films is directly dependent on (along with other factors) the ratio of gas components in a source gas mixture. A mis-processed batch of semiconductor wafers, or other other GCIB processed products, can be a costly error.

Furthermore, it is often desirable to have a process check on the mixture of the source gases or on the constitution of the gas-cluster ions in order to assure that the correct gas mixture is being used and/or that the correct gas-cluster ion constitution results. However, it is often costly, or may be otherwise impractical, to perform a chemical analysis of a premixed gas bottle before use in a GCIB processing apparatus. Moreover, at other times, a gas mixture may be formed in the GCIB apparatus tool itself. In these situations, conventional GCIB processing apparatus are unable to control the flows of the individual process gases combined to form the gas mixture.

For these and other reasons, there is a need for improved GCIB processing apparatus and methods of controlling a composition of the gas mixture used to form a gas cluster ion beam.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION OF CERTAIN EMBODIMENTS OF THE INVENTION

Figure 1:
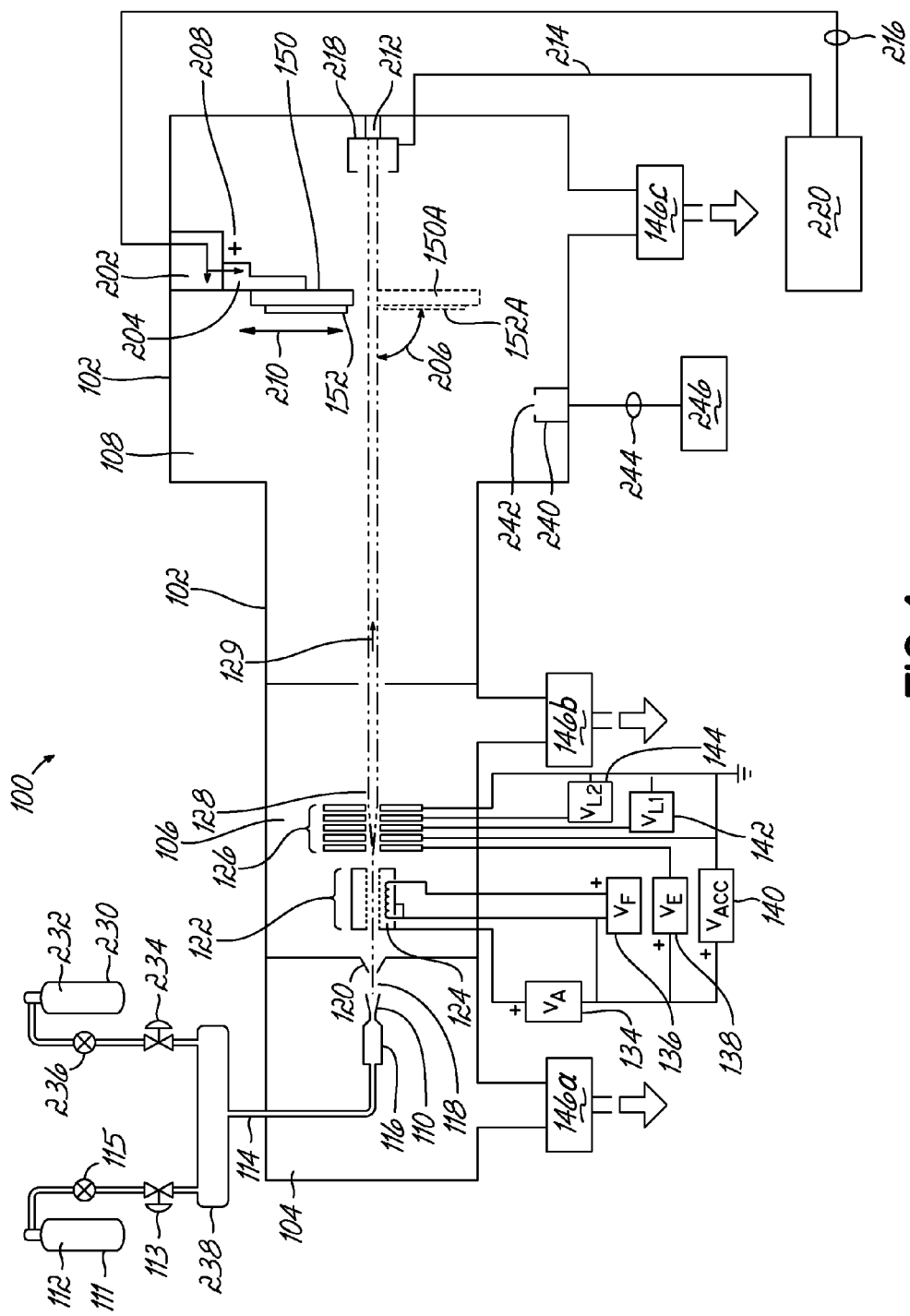
FIG. 1 is a schematic view showing a GCIB processing apparatus in accordance with the prior art.

With reference to FIG. 1, a typical configuration for a GCIB processing apparatus 100 includes a vacuum vessel 102 is divided into three communicating chambers, namely, a source chamber 104, an ionization/acceleration chamber 106, and a processing chamber 108. The three chambers 104, 106, 108 are evacuated to suitable operating pressures by vacuum pumping systems 146a, 146b, and 146c, respectively.

A first condensable source gas 112 (for example argon or nitrogen or a premixed gas mixture) stored in a first gas source 111 is admitted under pressure through a first gas shut-off valve 115 and through a first gas metering valve 113 and through gas manifold 238 and gas feed tube 114 into stagnation chamber 116. An optional second condensable source gas 232 (for example, carbon dioxide, oxygen, diborane, $NF_3$, silane, germane, or a premixed gas mixture) stored in an optional second gas source 230 is optionally admitted under pressure through a second gas shut-off valve 236 and through a second gas metering valve 234. When both source gases 111, 232 are used, they mix in gas manifold 238 before entering gas feed tube 114. The gas sources 111, 232 are located external to the vacuum vessel 102. Although not shown in FIG. 1, the gas metering valves 113 and 234 may be electronically, or otherwise remotely controlled, for open-loop setting of the approximate mixture generated in the gas manifold 238.

The gas or gas mixture in the stagnation chamber 116 is ejected into the substantially lower pressure vacuum through a properly shaped nozzle 110. A supersonic gas jet 118 results. Cooling, which results from the expansion in the jet, causes a portion of the gas jet 118 to condense into gas clusters, each consisting of from several to several thousand weakly bound atoms or molecules. A gas skimmer aperture 120 partially separates the gas molecules that have not condensed into a gas cluster jet from the gas cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases and/or gas mixtures.

After the supersonic gas jet 118 containing gas clusters has been formed, the gas clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the gas clusters, causing a portion of the gas clusters to become positively ionized. Some gas clusters may have more than one electron ejected and, as a result, may become multiply ionized.

A set of suitably biased high voltage electrodes 126 extracts the gas cluster ions from the ionizer 122, forming a beam, and then accelerates them to a desired energy (typically with acceleration potentials of from several hundred V to several tens of kV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the gas cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other type of workpiece to be processed by GCIB processing, is held on a workpiece holder 150, is disposed in the path of the GCIB 128. Because most applications contemplate the processing of large workpieces with spatially uniform results, a scanning system is desirable to uniformly scan the GCIB 128 across large areas to produce spatially homogeneous results. The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152.

The workpiece holder 150 disposes the workpiece 152 at an angle with respect to the axis of the GCIB 128 so that the GCIB 128 has an angle of beam incidence 206 with respect to the surface of the workpiece 152. The angle of beam incidence 206 may be 90° or some other angle, but is typically 90° or near 90°. During Y-scanning, the workpiece 152 and the workpiece holder 150 move from the position shown to the alternate position "A" indicated by the reference numerals 152A and 150A respectively. When moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal direction of X-scan motion 208 (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a Faraday cup or the like, closed except for a beam-entry opening, and is typically affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered. Although not shown, controller 220 may be a general-purpose computer or controller that controls multiple functions (or all of the functions) required in the operation of the GCIB processing apparatus 100, including operator interface functions, process monitoring and alarm functions, and the ability to halt GCIB processing in the event of a system fault.

An optional residual gas analyzer 240 has an aperture 242 for admitting low pressure gas from the gaseous environment inside process chamber 108. The residual gas analyzer 240 is connected by electrical cable 244 to a residual gas analyzer controller 246 for optionally analyzing and displaying the partial pressures of low pressure gases in the process chamber 108. This information may be for diagnostic purposes.

Figure 2:
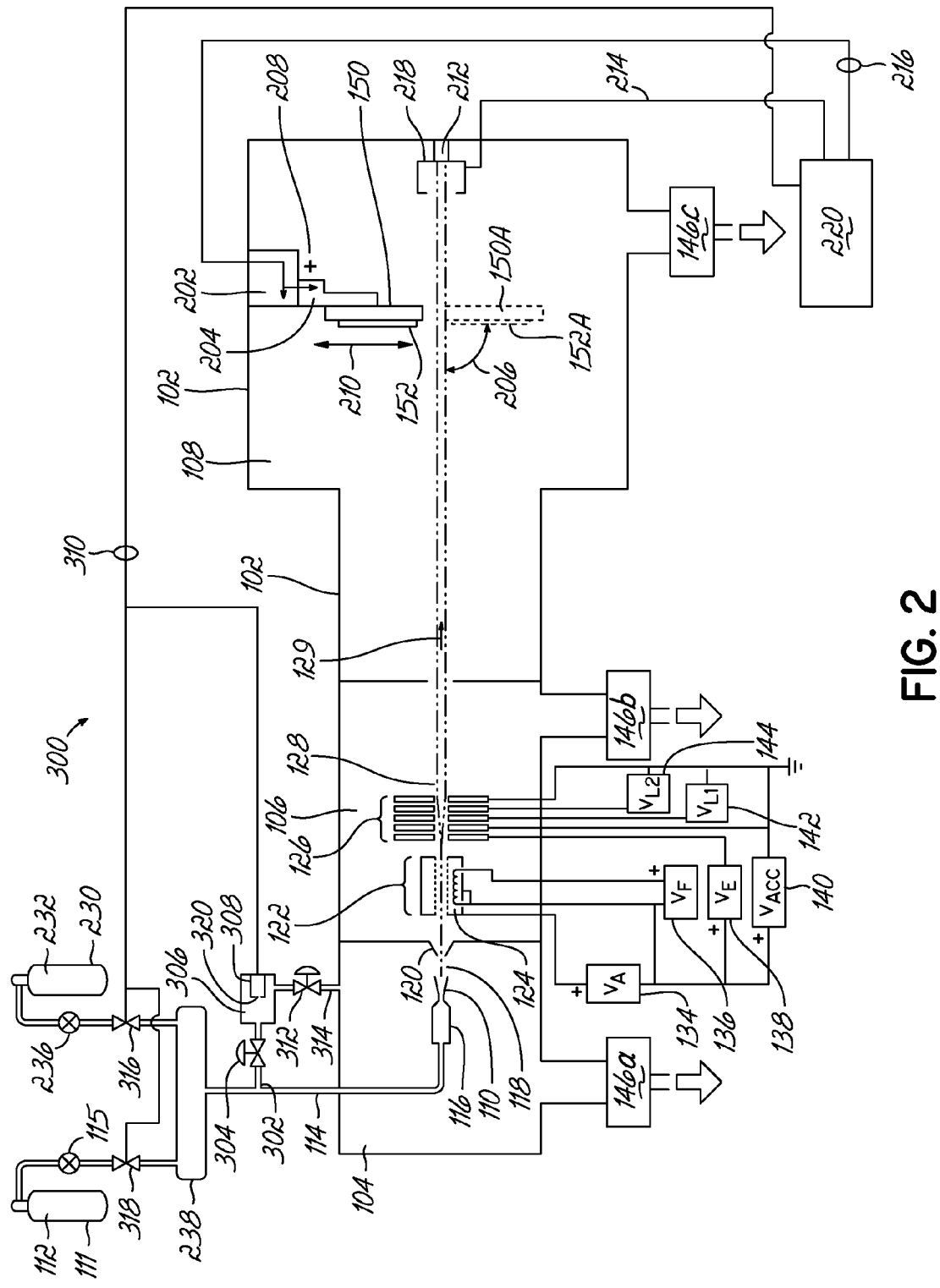
FIG. 2 is a schematic view showing a GCIB processing apparatus in accordance with an embodiment of the invention.

With reference to FIG. 2 in which like reference numerals refer to like features in FIG. 1, a GCIB processing apparatus 300 is constructed similar to GCIB processing apparatus 100 (FIG. 1) but includes modifications in accordance with a first embodiment of the invention. Gas sources 111 and/or 230 provide a pressurized gas mixture through gas shut-off valve 115 and/or gas shut-off valve 236, through gas metering valve 318 and/or gas metering valve 316, through gas manifold 238, and through gas feed tube 114 to stagnation chamber 116 for ejection through nozzle 110 to form a cluster jet 118. Gas metering valves 316 and 318 are adapted to be remotely controllable such that the flow of gas metered through each is independently controllable by a controller 220.

A sample of the pressurized gas mixture in gas feed tube 114 flows through gas sampling tube 302 and through a throttling valve 304 into an analysis chamber 306. From the analysis chamber, the gas mixture flows through throttling valve 312 and through exhaust tube 314 into a vacuum as for example, the source chamber 104 that is evacuated and maintained at a low pressure by vacuum pumping system 146a as shown in FIG. 1.

Analysis chamber 306 contains a gas analyzer 308 that is capable of sensing and analyzing the relative concentrations of two or more constituents of the gas mixture (i.e., individual gases in the gas mixture). These relative concentrations define gas analysis data that can be used to determine a composition of the gas mixture entering the analysis chamber 306. Such gas analyzers 308 often require, for proper operation, that the pressure of the gas being analyzed be within certain limits characteristic of the particular gas analyzer utilized.

The gas analyzer 308 is configured to sample the flow of the gas mixture from the gas sources 111 and/or 230. The gas analyzer 308 is further configured to determine gas analysis data from the sample of the gas mixture, as explained herein, and to generate signals relating to the gas analysis data for use in controlling the gas mixture and/or aborting the GCIB process if the gas mixture is outside of an acceptable range. The gas analyzer 308 may have any known construction as understood by a person having ordinary skill in the art.

In one embodiment, gas analyzer 308 may be a quadrupole mass spectrometer residual gas analyzer (RGA), which typically operates best in the low pressure range of from about $1 \times 10^{-10}$ torr to about $5 \times 10^{-4}$ torr (about $1.3 \times 10^{-8}$ Pa to about $6.7 \times 10^{-2}$ Pa). An RGA typically dissociates and ionizes a volume of the gas under analysis, then employs a compact mass spectrometer to determine the relative quantities of various constituents or species in the volume of gas. In an alternative embodiment, gas analyzer 308 may be a microplasma emission spectrometer (MPES), which typically operates best in the higher pressure range of about $1 \times 10^{-3}$ torr to about 10 torr (about 0.13 Pa to about 1,300 Pa), or even higher. A MPES typically forms a plasma of the gas under analysis and spectrally analyzes emissions from the plasma to determine the relative quantities of various constituents or species in the gas volume.

In yet another embodiment, the gas analyzer 308 may be an acoustical gas concentration sensor (AGCS), which typically operates best in the much higher pressure range of about 20 torr to about 8,000 torr (about $2.7 \times 10^3$ Pa to about $1.1 \times 10^6$ Pa). An AGCS typically infers a gas mixture of known component gases by measuring acoustical properties of the mixture and may be most useful when the molecular weights of the gases being mixed (including pre-mixed gas mixtures) are precisely known. As used herein, the term "analysis" encompasses measurements of gas mixtures that confirm the required mixture components are present in correct ratios without actually disassembling the gas mixture into component parts to perform the measurement. For example, the gas analyzer 308 may measure a property of the gas mixture including, but not limited to, an acoustical property.

The pressure in the analysis chamber 306 is determined by the adjustment (or alternatively by selecting a fixed value for one or both) of the respective conductances of throttling valves 304 and 312. Although two throttling valves 304 and 312 are shown for exemplary purposes, it will be understood by those skilled in the art, that either or both of the throttling valves 304 and 312 can be replaced by a fixed orifice (not shown) with a predetermined conductance or that throttling valve 304 can be replaced by a pressure regulator. Accordingly, the pressure, PA, in the analysis chamber 306 can be set and maintained in a range of pressures compatible with successful operation of the type of gas analyzer 308 employed in the invention, whether RGA, MPES, AGCS, or other.

Gas analyzer 308 has an aperture 320 for allowing entrance of the sample of the gas mixture from the analysis chamber 306 for analysis. The gas analyzer 306 communicates with controller 220 through electrical leads in electrical cable 310. The gas analyzer 306 receives necessary power and control signals through electrical cable 310 and returns signals containing gas analysis data relative to the relative magnitudes of two or more constituents of the gas mixture. For example, in the case of a mixture of argon, oxygen, and $NF_3$ for reactive etching, the signals returned to the controller 220 may include amplitudes related to the $Ar^+$, $O^+$, $N^+$ and $F^+$ ions present in the mixture as determined by mass spectroscopy, or plasma emission analysis, or by other measurement means appropriate to the particular type of gas analyzer 308 employed. The controller 220 may determine ratios between two or more components, for example $Ar^+$, $O^+$, and $F^+$ ions, and calculate the ratios in the mixture of the gases argon, oxygen, and $NF_3$. Various factors may affect the output signals of various types of gas analyzers, such as the relative ionization efficiencies of different constituents of the gas mixture. However, such variations can be managed by providing a calibration, according to known techniques, of the measurement system using a gas or gases of known mixture.

In operation, the controller 220 compares ratios of the gas constituents as measured by the gas analyzer 308 including any necessary calibrations. The controller 220 also determines whether the gas being sampled from gas feed tube 114 is within predetermined allowable limits for the GCIB process. If the gas mixture is determined by the controller 220 to be outside of allowable limits based upon one or more of the gas constituent ratios, the controller 220 can abort the process, for example, by moving the workpiece 152 completely out of the path of the GCIB 128 so that the GCIB 128 enters the beam current sensor 218 and signal an alarm to prevent mis-processing of workpieces in the GCIB processing apparatus 300. Alternatively, in the case where differing gases from gas sources 111 and 230 are being mixed in gas manifold 238, the controller 220 can send control signals to gas metering valve 316 and/or gas metering valve 318 through electrical leads in electrical cable 310 to increase or decrease the flow in either or both of valves 316 and 318 as appropriate to restore the gas mixture in gas feed tube 114 and re-establish a gas mixture that is within allowable limits for the GCIB process requirements.

In one embodiment, two gas sources 111, 230 may be used. The first gas source 111 may contain a mixture of, for example, first gas A and second gas B and a second gas source 230 may contain a pure gas B. In this embodiment, the gas mixture in gas source 111 contains a mixture that is slightly rich in gas A relative to gas B compared to the required mixture. Thus, by increasing the flow from gas source 230 relative to that from gas source 111, the mixture resulting in gas manifold 238 can be diluted to the precise required gas mixture required for the process.

Figure 3:
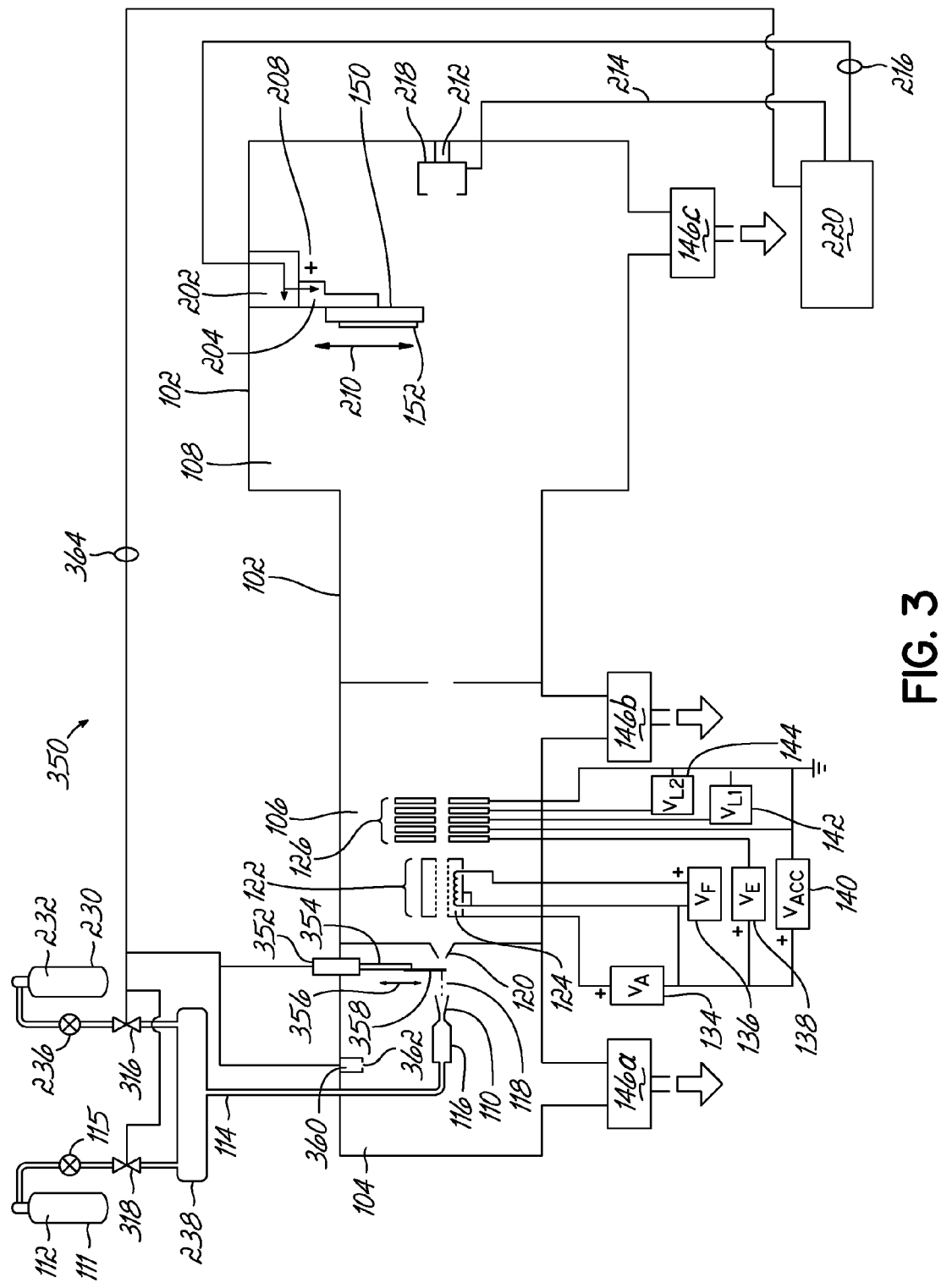
FIG. 3 is a schematic view showing a GCIB processing apparatus in accordance with an alternative embodiment of the invention.

With reference to FIG. 3 in which like reference numerals refer to like features in FIGS. 1 and 2, a GCIB processing apparatus 350 is constructed similar to GCIB processing apparatus 200 (FIG. 2), but includes modifications in accordance with a second embodiment of the invention. Instead of analyzing a sample of high pressure gas from the gas feed tube 114 as done by GCIB processing apparatus 200 (FIG. 1) in the first embodiment, GCIB processing apparatus 350 includes a gas analyzer 360 located in the source chamber 104 in the vicinity of the nozzle 110 and the skimmer aperture 120. Gas analyzer 360 has an aperture 362 for allowing entrance of samples of residual gases from the evacuated gaseous environment inside the source chamber 104 for analysis.

The gas analyzer 360 is electrically coupled with controller 220 through electrical leads in electrical cable 364. The gas analyzer 360 generates signals relating to the sampled residual gases and communicates those signals as gas analysis data via electrical cable 364 to the controller 220. The gas analyzer 360 receives necessary power and control signals through electrical cable 364 and returns signals containing gas analysis data on the relative magnitudes of two or more constituents of the gas mixture to the controller 220. The source chamber 104 normally operates in a pressure range suitable for use of a low pressure range operating gas analyzer, such as, for example, an RGA. Gas ejected from the nozzle 110 that does not contribute to the formation of the cluster jet 118 does not pass through the skimmer aperture 120 and contributes to a low pressure background gas in the source chamber 104, having the same mixture as the mixed gas being ejected from the nozzle 110.

Optionally, GCIB processing apparatus 350 may employ a linear actuator 352 that actuates a shaft 354 with an attached shutter 358. Actuator 352 imparts a controllable reciprocating motion 356 to the shaft 354 and shutter 358. The shutter 358 is controllably removed from the path of the gas jet 118 (for normal GCIB processing) or introduced into the gas jet 118, intercepting it before it reaches the skimmer aperture 120 and passes out of the source chamber 104, for gas mixture measurement. When the shutter 358 intercepts the gas jet 118, the gas clusters become dissociated and, as a consequence, the pressure in the source chamber 104 is substantially increased. The pressure in the source chamber 104 rises into the pressure range where a high pressure range operating gas analyzer, such as, for example, an MPES, can be employed as gas analyzer 360 for analyzing the mixture of the source gas. Such high pressure operation may reduce errors in measuring the source gas mixture because of small undesired leaks of atmosphere into the source chamber 104.

In either case (low pressure gas analyzer 360 without shutter 358, or high pressure range gas analyzer 360 with shutter 358), constituents of the source gas mixture present in the source chamber 104 are measured by the gas analyzer 360 and signals representing the measured gas mixture constituents are returned from the gas analyzer 360 as feedback to the controller 220. The signals may include amplitudes related to ions formed from the mixture as determined by mass spectroscopy, or plasma emission analysis, or by other measurement means appropriate to the particular type of gas analyzer 360 employed.

The controller 220 compares ratios of the gas constituents as measured by the gas analyzer 360, including any necessary calibrations, and determines whether the gas mixture is within predetermined allowable limits for the GCIB process. The numerical range for the gas mixture may be defined by an upper value and a lower value established for the GCIB process. If the gas mixture is outside of allowable limits, the controller 220 can abort the process, for example, by moving the workpiece 152 completely out of the path of the GCIB 128 so that the GCIB 128 enters the beam current sensor 218 and signal an alarm to prevent mis-processing of workpieces 152 in the GCIB processing apparatus 350. Alternatively, in the case where differing gases from gas sources 111 and 230 are being mixed in gas manifold 238, the controller 220 can send control signals to gas metering valve 316 and/or gas metering valve 318 through electrical leads in electrical cable 364 to increase or decrease the flow in either or both of valves 316 and 318 as appropriate to restore the gas mixture in source chamber 104 to a mixture that is within allowable limits for the GCIB process requirements.

Figure 4:
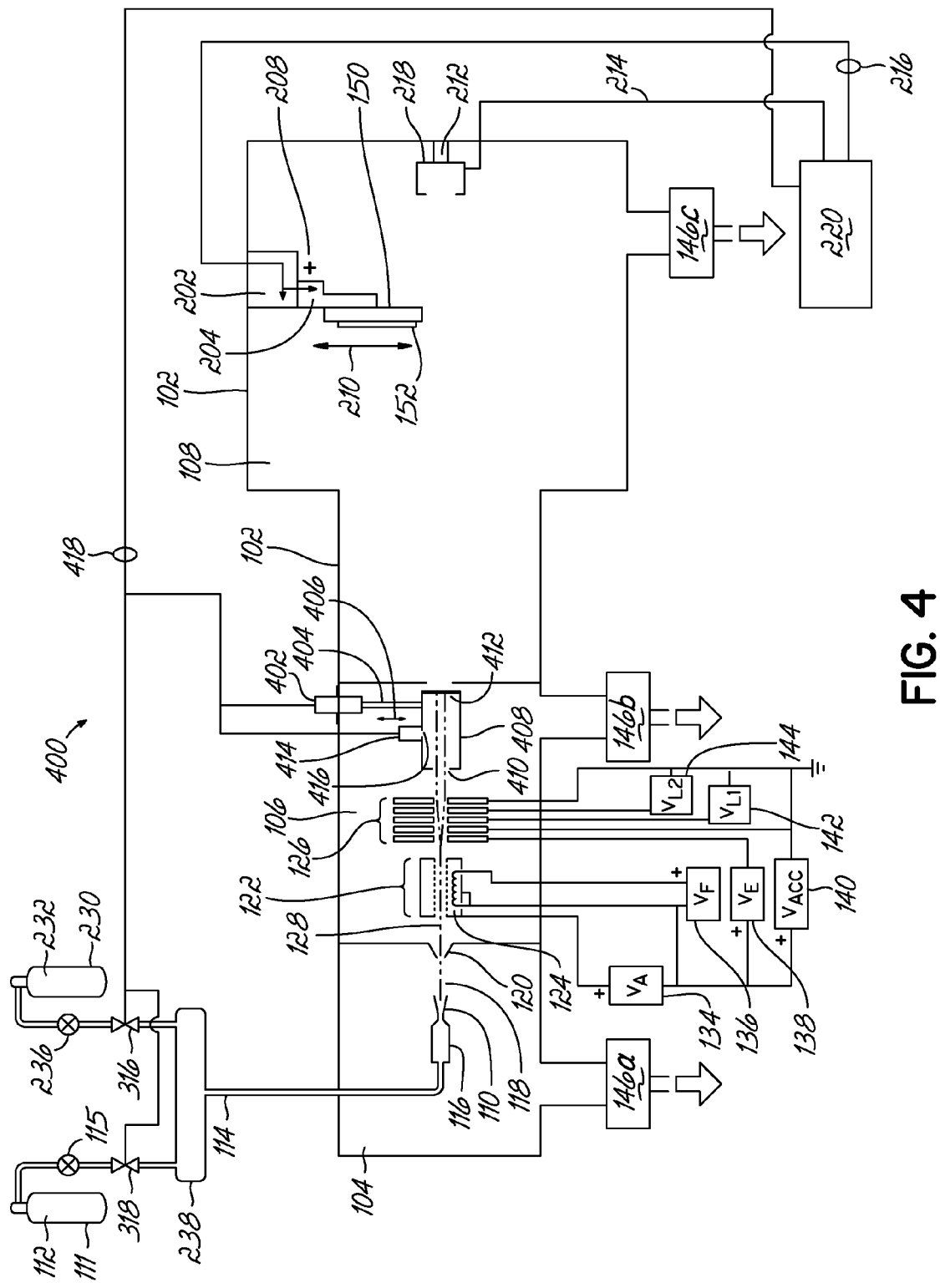
FIG. 4 is a schematic view showing a GCIB processing apparatus in accordance with an alternative embodiment of the invention.

With reference to FIG. 4 in which like reference numerals refer to like features in FIGS. 1-3, a GCIB processing apparatus 400 is constructed similar to GCIB processing apparatus 100 (FIG. 1), but includes modifications in accordance with a third embodiment of the invention. Instead of analyzing a sample of high pressure gas from the gas feed tube 114 as done by GCIB processing apparatus 200, GCIB processing apparatus 400 includes a gas analyzer 414 located downstream of the skimmer aperture 120. For example, the gas analyzer 414 may be located in the ionization/acceleration chamber 106 or, although not shown, in the processing chamber 108. It is known that incorporation of gas mixture components into a GCIB source gas does not necessarily result in gas cluster ions that have the same constitution as the source gas mixture.

The degree of incorporation of various gases in a gas mixture into gas cluster ions in the GCIB 128 may depend not only on the source gas mixture, but also on the gas flow rate through the nozzle 110. Accordingly, it may not be sufficient to simply control the source gas mixture as in the first and second embodiments of this invention. Even with the correct source gas mixture, the constitution of gas-cluster ions in a GCIB may vary with the nozzle gas flow. Accordingly, GCIB processing apparatus 400 measures and/or controls the actual constitution of the gas clusters in the GCIB 128.

GCIB processing apparatus 400 employs a linear actuator 402 that actuates a shaft 404 with an attached cluster dissociation chamber 408. Linear actuator 402 imparts a controllable reciprocating motion 406 to the shaft 404 and dissociation chamber 408. The dissociation chamber 408 is controllably removed from the path of the GCIB 128 (for normal GCIB processing) or introduced into the GCIB 128, intercepting it before it reaches the workpiece 152 or the beam current sensor 218, for gas mixture measurement. Although shown here located in the ionization/acceleration chamber 106, it will be understood by those skilled in the art that dissociation chamber 408 can be located at any convenient location downstream of the skimmer aperture 120 and before the GCIB 128 impacts the workpiece 152 or the beam current sensor 218, or any other object that dissociates the gas cluster ions. It will also be understood by those skilled in the art that although shown in FIG. 4 located downstream of the high voltage electrodes 126 (after acceleration of the GCIB) and intercepting the GCIB 128, that dissociation chamber 408 can also be placed (not shown) between the skimmer aperture 120 and the ionizer 122 (after skimming un-clustered gas from the clusters, and before ionization and acceleration to form GCIB 128) where it intercepts the non-ionized clusters from the gas jet 118 prior to being ionized and accelerated.

The cluster dissociation chamber 408 has an aperture 410 and a strike plate 412. The linear actuator 402 is configured to manipulate the cluster dissociation chamber 408 so that the GCIB 128 (or alternatively the non-ionized clusters from the gas jet 118) pass through the aperture 410 and impact the strike plate 412. Upon impact, the gas cluster ions in the GCIB 128 dissociate and cause the pressure, PDC, in the dissociation chamber 408 to rise into the range of from about $1 \times 10^{-3}$ torr to about 10 torr (about 0.13 Pa to about 1300 Pa), or even higher. Gas analyzer 414 may be capable of operating high pressure range and, in a specific embodiment, may be an MPES coupled with dissociation chamber 408 through an aperture 416. Gas analyzer 414 analyzes the gas mixture resulting from the dissociation of the gas cluster ions in the GCIB 128.

The gas analyzer 414 communicates with controller 220 through electrical leads in electrical cable 418. The gas analyzer 414 receives necessary power and control signals through electrical cable 418 and returns signals containing information on the relative magnitudes of two, or more, constituents of the gas mixture to the controller 220.

Constituents gases of the gaseous environment present in the dissociation chamber 408 are measured by the gas analyzer 414 and signals in the form of gas analysis data are returned to the controller 220. The signals may include amplitudes related to ions formed from the gas mixture as determined by plasma emission analysis, or by other measurement means appropriate to the particular type of gas analyzer 414 employed. The controller 220 may determine ratios between two or more components and calculate the ratios in the gas cluster ions in the GCIB 128. The controller 220 compares ratios of the gas constituents as measured by the gas analyzer 414, including any necessary calibrations and determines whether the gas being sampled from GCIB 128 is within predetermined allowable limits for the GCIB process. If the gas mixture is outside of allowable limits, the controller can abort the process, for example, by moving the workpiece 152 completely out of the path of the GCIB 128 so that the GCIB 128 enters the beam current sensor 218 and signal an alarm to prevent mis-processing of workpieces in the GCIB processing apparatus 400.

Alternatively, in the case where a pre-mixed gas is being supplied from only one or the other of gas sources 111 or 230, the controller 220 can send control signals to gas metering valves 316 or gas metering valve 318 through electrical leads in electrical cable 418 to increase or decrease gas flow in the appropriate valve as appropriate to modify the respective rates of incorporation of two components from the gas mixture into the gas cluster ions in GCIB 128 to a mixture that is within allowable limits for the GCIB process requirements. Additionally, in the other case where differing gases from gas sources 111 and 230 are being mixed in gas manifold 238, the controller 220 can send control signals to gas metering valve 316 and/or gas metering valve 318 through electrical leads in electrical cable 418 to increase or decrease the flow in either or both of valves 316 and 318 as appropriate to restore the gas mixture in gas feed tube 114 to a mixture that restores the proper ratio of constituents in the gas cluster ions in the GCIB 128.

Figure 5:
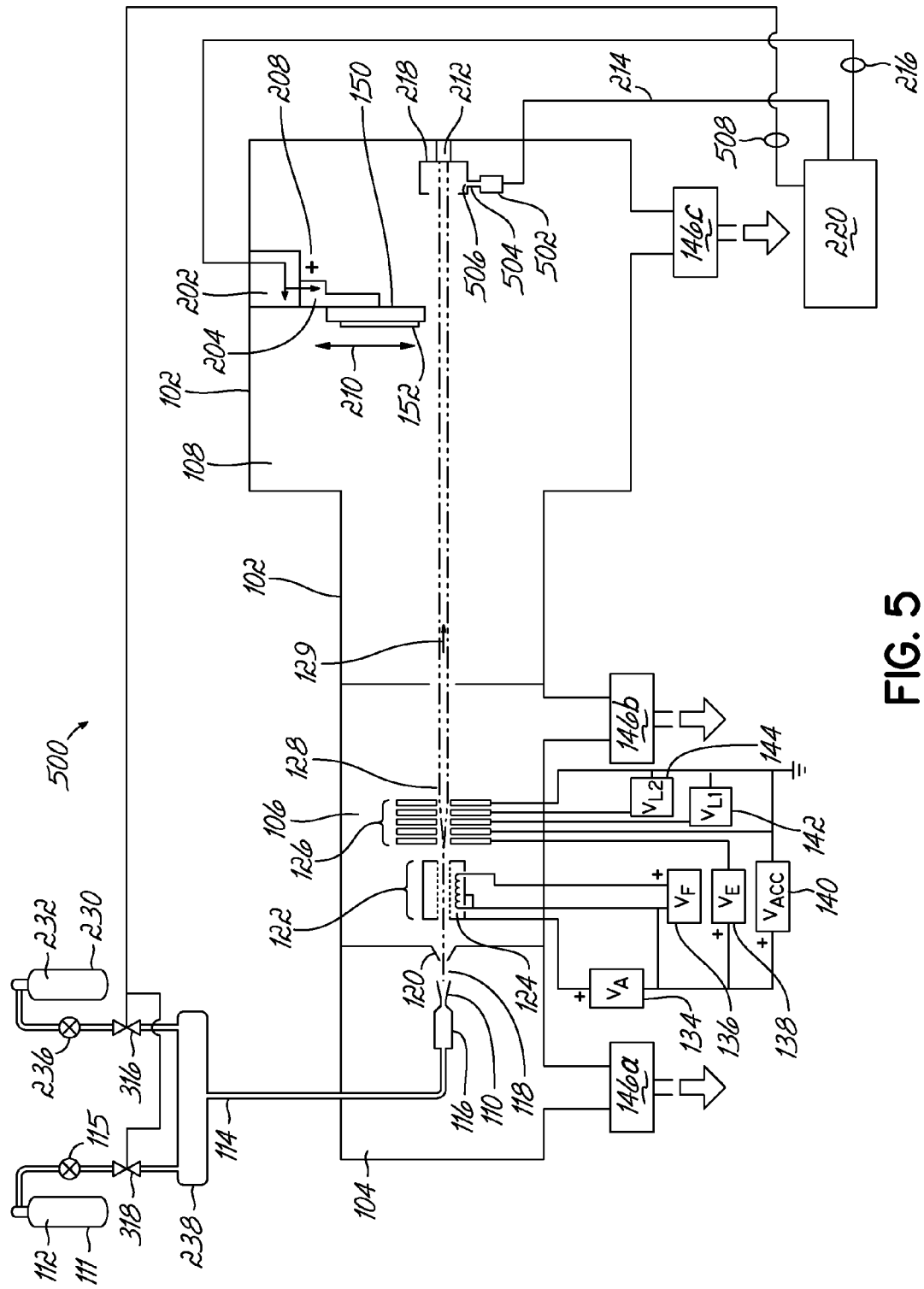
FIG. 5 is a schematic view showing a GCIB processing apparatus in accordance with an alternative embodiment of the invention.

With reference to FIG. 5 in which like reference numerals refer to like features in FIGS. 1-4, a GCIB processing apparatus 500 of a form similar to that of FIG. 4, but with modifications according to a fourth embodiment of the present invention. Instead of analyzing a dissociated sample of high pressure gas from dissociated gas cluster ions from the GCIB 128 by inserting a removable dissociation chamber into the GCIB as in the third embodiment, this fourth embodiment uses the existing current sensor 218 as a dissociation chamber for gas cluster ion analysis. The current sensor 218 is typically a Faraday cup, which is a cup-shaped container well known in the ion beam dosimetry art.

When gas cluster ions within the GCIB 128 impact in the cup-shaped current sensor 218, they dissociate and increase the pressure in the sensor 218. The current sensor 218 normally measures the charge carried into the sensor 218 by the GCIB 128 as part of the dosimetry function for controlling GCIB processing. In this fourth embodiment, the current sensor 218, which may have a cup shape for this embodiment, also serves to measure the constituents of the dissociated gas cluster ions striking it. Because of the high rate of dissociation of gas in the current sensor 218, the pressure therein is increased into the range of from about $1 \times 10^{-3}$ torr to about 10 torr (about 0.13 Pa to about 1300 Pa), or even higher, where a high pressure range operating gas analyzer such as an MPES can be employed as a gas analyzer.

A gas analyzer 502 is connected the current sensor 218 through an aperture 506 and an electrical isolation tube 504. Electrical isolation tube 504 prevents the attachment of gas analyzer 502 to current sensor 218 from adversely affecting the beam current measurement function of current sensor 218, while allowing dissociation products from the dissociated gas cluster ions to enter the gas analyzer 502. Gas analyzer 502 samples and analyzes the gas mixture resulting from the dissociation of the gas cluster ions in the current sensor 218, which effectively operates as a dissociation chamber for the gas cluster ions. The gas analyzer 502 communicates with controller 220 through electrical leads in electrical cable 508. The gas analyzer receives necessary power and control signals through electrical cable 508 and returns signals containing gas analysis data on the relative magnitudes of two or more constituents of the gas mixture to the controller 220.

Constituents of the gas mixture present in the current sensor 218 is measured by the gas analyzer 502 and signals are returned to the controller 220, which may include amplitudes related to ions formed from the gas mixture as determined by plasma emission analysis, or by other measurement means appropriate to the particular type of gas analyzer 414 employed. The controller 220 may determine ratios between two or more components and calculate the ratios in the gas cluster ions in the GCIB 128. The controller 220 compares ratios of the gas constituents as measured by the gas analyzer 414, including any necessary calibrations, and determines from one or more of the gas ratios whether the gas being sampled from GCIB 128 is within predetermined allowable limits for the GCIB process. The numerical range for the gas mixture may be defined by an upper value and a lower value established for the GCIB process.

If the gas mixture is outside of allowable limits, the controller 220 can abort the process and signal an alarm to prevent mis-processing of workpieces in the GCIB processing apparatus 500. Alternatively, in the case where a pre-mixed gas is being supplied from only one or the other of gas sources 111 or 230, the controller 220 can send control signals to gas metering valves 316 or gas metering valve 318 through electrical leads in electrical cable 508. The controls signals are used to increase or decrease gas flow in the respective one of the valves 316, 318, as appropriate, which modifies the respective rates of incorporation of two components from the gas mixture into the gas cluster ions in GCIB 128 to a mixture that is within allowable limits for the GCIB process requirements. Additionally, in the other case where differing gases from gas sources 111 and 230 are being mixed in gas manifold 238, the controller 220 can send control signals to gas metering valve 316 and/or gas metering valve 318 through electrical leads in electrical cable 508 to increase or decrease the flow in either or both of valves 316 and 318 as appropriate to restore the gas mixture in gas feed tube 114 to a mixture that restores the proper ratio of constituents in the gas cluster ions in the GCIB 128.

Figure 6:
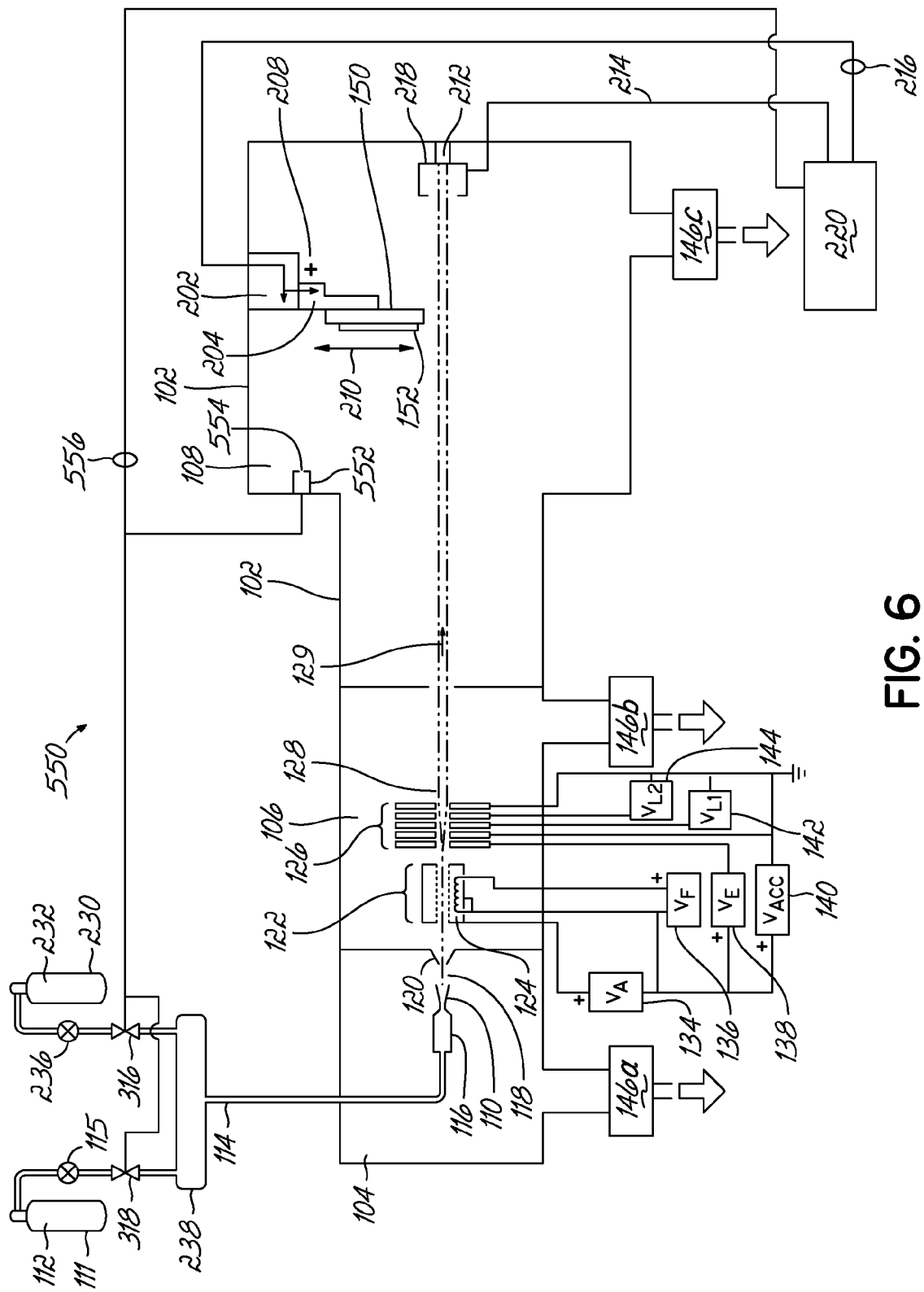
FIG. 6 is a schematic view showing a GCIB processing apparatus in accordance with an alternative embodiment of the invention.

With reference to FIG. 6 in which like reference numerals refer to like features in FIGS. 1-5, a GCIB processing apparatus 550 of a form similar to that of FIG. 1, but with modifications according to a fifth embodiment of the present invention. Instead of using an RGA as a stand-alone device to measure the pressure of gas in the process chamber 108 as in the prior art system of FIG. 1, in this fifth embodiment of the present invention, an RGA or other gas analyzer suitable for operating in the low pressure region of normal operation of the process chamber 108 (typically in the range of from about $1 \times 10^{-6}$ torr to about $5 \times 10^{-4}$ torr (about $1.3 \times 10^{-4}$ Pa to about $6.7 \times 10^{-2}$ Pa)) is employed in combination with communication with controller 220 for active control of the GCIB constitution.

During operation for GCIB processing, GCIB 128 strikes the workpiece 152, or the current sensor 218, or other objects in the process chamber 108 and is dissociated into its constituent gases. A gas analyzer 552 having an aperture 554 for permitting entry of gas from the process chamber 108 into the gas analyzer 552. Gas analyzer 552 analyzes the gas mixture resulting from the dissociation of the gas cluster ions in the process chamber 108. The gas analyzer 552 communicates with controller 220 through electrical leads in electrical cable 556. The gas analyzer 552 receives necessary power and control signals through electrical cable 556 and returns signals containing gas analysis data on the relative magnitudes of two or more constituents of the gas mixture to the controller 220.

Constituents of the gas mixture present in the process chamber 108 is measured by the gas analyzer 552 and signals are returned to the controller 220, which may include amplitudes related to ions formed from the gas mixture as determined by plasma emission analysis, or by other measurement means appropriate to the particular type of gas analyzer 552 employed. The controller may determine ratios between two or more components and calculate the ratios in the gas cluster ions in the GCIB 128. The controller 220 compares ratios of the gas constituents as measured by the gas analyzer 552, including any necessary calibrations, and determines whether the gas being sampled from GCIB 128 is within predetermined allowable limits for the GCIB process. If the gas mixture is outside of allowable limits, the controller can abort the process and signal an alarm to prevent mis-processing of workpieces in the GCIB processing system.

Alternatively, in the case where a pre-mixed gas is being supplied from only one or the other of gas sources 111 or 230, the controller 220 can send control signals to gas metering valves 316 or gas metering valve 318 through electrical leads in electrical cable 556 to increase or decrease gas flow in the appropriate valve as appropriate to modify the respective rates of incorporation of two components from the gas mixture into the gas cluster ions in GCIB 128 to a mixture that is within allowable limits for the GCIB process requirements. Additionally, in the other case where differing gases from gas sources 111 and 230 are being mixed in gas manifold 238, the controller 220 can send control signals to gas metering valve 316 and/or gas metering valve 318 through electrical leads in electrical cable 556 to increase or decrease the flow in either or both of valves 316 and 318 as appropriate to restore the gas mixture in gas feed tube 114 to a mixture that restores the proper ratio of constituents in the gas cluster ions in the GCIB 128.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A gas cluster ion beam apparatus for irradiating a workpiece with a gas cluster ion beam generated from a gas mixture, the gas cluster ion beam apparatus comprising:
a vacuum vessel having a first chamber and a second chamber in fluid communication with said first chamber, wherein said workpiece holder is located on a workpiece holder in said second chamber;
a gas cluster ion beam source in said first chamber, the gas cluster ion beam source configured to produce a gas jet containing gas clusters of the gas mixture;
a nozzle on the gas cluster ion beam source, said nozzle configured to eject the gas mixture into said first chamber as the gas jet;
a movable member inside said first chamber, said movable member configured to move between a first position out of a path of the gas jet and a second position in which the gas jet impacts said movable member such that the gas clusters of the gas jet are dissociated to form residual gases; and
a gas analyzer coupled with said first chamber, said gas analyzer configured to analyze the residual gases and to generate gas analysis data; and
a controller coupled with said gas analyzer, said controller configured to modify the irradiation of the workpiece in response to the gas analysis data communicated from said gas analyzer.

2. The gas cluster ion beam apparatus of claim 1 wherein said controller is further configured to compute control signals based on the gas analysis data communicated from said gas analyzer, and the gas cluster ion beam apparatus further comprising:
a first gas source configured to contribute at least a first gas to the gas mixture; and
a first metering valve electrically coupled with said controller, said first metering valve configured to adjust a flow of the first gas from said first gas source to said gas cluster ion beam source in response to the control signals communicated from said controller and to modify the irradiation of the workpiece.

3. The gas cluster ion beam apparatus of claim 2 further comprising:
a second gas source configured to contribute at least a second gas to the gas mixture; and
a second metering valve electrically coupled with said controller, said second metering valve configured to adjust a flow of the second gas from said second gas source to said gas cluster ion beam source in response to the control signals communicated from said controller.

4. The gas cluster ion beam apparatus of claim 3 wherein said controller is configured to terminate the irradiation of the workpiece if the gas analysis data indicates that the gas mixture is outside of an allowable numerical range.

5. A gas cluster ion beam apparatus for irradiating a workpiece with a gas cluster ion beam generated from a gas mixture, the gas cluster ion beam apparatus comprising:
- a vacuum vessel having first, second, and third chambers, wherein the third chamber is positioned between the first and second chambers and is in fluid communication with the first and second chambers, wherein said workpiece holder is located on a workpiece holder in said second chamber;
- a gas cluster ion beam source disposed in said first chamber, said gas cluster ion beam source configured to produce a gas jet containing gas clusters of the gas mixture;
- an ionizer in said third chamber, said ionizer configured to ionize at least a fraction of the gas clusters in the gas jet to define gas cluster ions;
- an accelerator disposed in said third chamber, said accelerator configured to apply an electrical bias effective to accelerate the gas cluster ions to form the gas cluster ion beam;
- a movable member inside said third chamber, said movable member configured to move between a first position out of a path of the gas cluster ion beam and a second position in which the gas cluster ion beam impacts said movable member such that the gas cluster ions are dissociated to form residual gases;
- a gas analyzer coupled with said vacuum vessel, said gas analyzer configured to analyze the residual gases and to generate gas analysis data; and
- a controller coupled with said gas analyzer, said controller configured to modify the irradiation of the workpiece in response to the gas analysis data communicated from said gas analyzer.

6. The gas cluster ion beam apparatus of claim 5 further comprising:
- a current sensor positioned in said second chamber for irradiation by the gas cluster ion beam, said current sensor coupled in fluid communication with said gas analyzer.

7. The gas cluster ion beam apparatus of claim 6 wherein said workpiece holder is configured to move the workpiece between a first position in which the workpiece is irradiated by the gas cluster ion beam and a second position in which the gas cluster ion beam impacts said current sensor such that the gas cluster ions are dissociated.

8. The gas cluster ion beam apparatus of claim 5 wherein said controller is further configured to compute control signals based on the gas analysis data communicated from said gas analyzer, and the gas cluster ion beam apparatus further comprising:
- a first gas source configured to contribute at least a first gas to the gas mixture; and
- a first metering valve electrically coupled with said controller, said first metering valve configured to adjust a flow of the first gas from said first gas source to said gas cluster ion beam source in response to the control signals communicated from said controller and to modify the irradiation of the workpiece.

9. The gas cluster ion beam apparatus of claim 8 further comprising:
- a second gas source configured to contribute at least a second gas to the gas mixture; and
- a second metering valve electrically coupled with said controller, said second metering valve configured to adjust a flow of the second gas from said second gas source to said gas cluster ion beam source in response to the control signals communicated from said controller.

10. A method for processing a workpiece with a gas cluster ion beam generated from a gas mixture, the method comprising:
- communicating a flow of the gas mixture to a gas cluster ion beam source disposed inside a vacuum vessel;
- forming a gas cluster ion beam from the flow of the gas mixture using the gas cluster ion beam source;
- irradiating the workpiece with the gas cluster ion beam;
- disrupting the irradiating of the workpiece with a moveable member, whereby the disrupting generates residual gases;
- generating gas analysis data from the residual gases in the evacuated gaseous environment inside the vacuum vessel; and
- modifying the irradiation of the workpiece in response to the gas analysis data.

11. The method of claim 10 wherein modifying the irradiation of the workpiece comprises:
- determining from the gas analysis data whether the gas mixture is within an allowable numerical range; and
- terminating the irradiation of the workpiece by the gas cluster ion beam if the gas mixture is outside of the allowable numerical range.

12. The method of claim 10 wherein modifying the irradiation of the workpiece further comprising:
- determining from the gas analysis data whether the gas mixture is within an allowable numerical range; and
- adjusting a composition of the gas mixture in the flow to the gas cluster ion beam source if the gas mixture is outside of the allowable numerical range.

13. The method of claim 12 wherein adjusting the composition of the gas mixture further comprises:
- controlling a plurality of metering valves to adjust the composition of the gas mixture.

14. The method of claim 10 wherein forming the gas cluster ion beam further comprises:
- ejecting the gas mixture through a nozzle and into the vacuum vessel to define a gas cluster jet containing gas clusters, wherein the disrupting dissociates the gas clusters to generate the residual gases inside the vacuum vessel.

15. The method of claim 14 wherein the disrupting further comprises:
- moving the movable member into a path of the gas cluster jet so that the gas clusters of the gas cluster jet impact a portion of the movable member and dissociate to form the residual gases.

16. The method of claim 10 wherein forming the gas cluster ion beam further comprises:
- ejecting the gas mixture through a nozzle and into the vacuum vessel to define a gas cluster jet containing gas clusters;
- ionizing at least a fraction of the gas clusters in the gas cluster jet to form gas cluster ions; and
- accelerating the fraction of the gas cluster ions to form the gas cluster ion beam.

17. The method of claim 16 wherein the disrupting dissociates the gas cluster ions to generate the residual gases inside the vacuum vessel.

18. The method of claim 17 wherein the disrupting further comprises:
- moving the movable member into a path of the gas cluster ion beam inside the vacuum vessel so that the gas cluster ions impact a portion of the movable member and dissociate to form the residual gases.

19. The method of claim 17 wherein dissociating the gas cluster ions further comprises:
- intercepting the gas cluster ion beam with a current sensor so that the gas cluster ions impact a portion of the current sensor and dissociate to form the residual gases.

* * * * *

UNITED STATES PATENT AND TRADEMARK OFFICE
CERTIFICATE OF CORRECTION

| | | |
|---|---|---|
| PATENT NO. | : 7,825,389 B2 | Page 1 of 1 |
| APPLICATION NO. | : 11/950128 | |
| DATED | : November 2, 2010 | |
| INVENTOR(S) | : John J. Hautala et al. | |

It is certified that error appears in the above-identified patent and that said Letters Patent is hereby corrected as shown below:

In column 3, line 1, before "divided", delete "is".

In column 4, line 5, change "150, is disposed" to --150 and is disposed--.

In column 8, line 14, change "signal" to --signals--.

In column 9:
Line 27, change "Constituents" to --Constituent--
Line 44, change "signal" to --signals--.

In column 10:
Line 2, after "invention", add --is shown--
Line 24, after "connected", insert --to--
Line 42, change "is" to --are--.

In column 11:
Line 16, after "invention", add --is shown--
Line 30, after "552", add --is shown--
Line 40, change "is" to --are--.

Signed and Sealed this
Twenty-second Day of February, 2011

David J. Kappos
*Director of the United States Patent and Trademark Office*